(12) United States Patent
Mizoguchi et al.

(10) Patent No.: US 7,358,750 B2
(45) Date of Patent: Apr. 15, 2008

(54) INSPECTION APPARATUS FOR PRINTED BOARD

(75) Inventors: Yasunori Mizoguchi, Hamamatsu (JP); Toru Ishii, Hamamatsu (JP); Kengo Tsuchida, Hamamatsu (JP)

(73) Assignee: Yamaha Fine Technologies Co., Ltd. (JP)

( * ) Notice: Subject to any disclaimer, the term of this patent is extended or adjusted under 35 U.S.C. 154(b) by 142 days.

(21) Appl. No.: 10/757,574

(22) Filed: Jan. 15, 2004

(65) Prior Publication Data

US 2004/0207418 A1    Oct. 21, 2004

(30) Foreign Application Priority Data

Jan. 17, 2003    (JP) .............................. 2003-008937

(51) Int. Cl.
*G01R 31/02* (2006.01)
*G01R 31/28* (2006.01)

(52) U.S. Cl. ........................ 324/754; 324/523; 324/528

(58) Field of Classification Search ..................... None
See application file for complete search history.

(56) References Cited

U.S. PATENT DOCUMENTS

| | | | |
|---|---|---|---|
| 5,469,064 A | | 11/1995 | Kerschner et al. |
| 5,672,978 A | * | 9/1997 | Kimura ........................ 324/754 |
| 6,097,202 A | * | 8/2000 | Takahashi .................... 324/761 |
| 6,411,079 B1 | * | 6/2002 | Nishikawa ................ 324/158.1 |
| 6,972,573 B2 | * | 12/2005 | Ishioka et al. ............... 324/523 |
| 2004/0059970 A1 | * | 3/2004 | Wieberdink et al. ........ 714/724 |

FOREIGN PATENT DOCUMENTS

| | | |
|---|---|---|
| CN | 1288160 A | 3/2001 |
| JP | 55-135760 | 10/1980 |
| JP | 62-269075 | 11/1987 |
| JP | 7-151834 | 6/1995 |
| JP | 11-340588 | 12/1999 |
| JP | 2001-133491 | 5/2001 |
| JP | 2001-289898 | 10/2001 |
| KR | 1999-0054226 | 7/1999 |

OTHER PUBLICATIONS

Korean Office Action mailed Aug. 31, 2005 (relevant portions translated to English).
Chinese Office Action issued Dec. 30, 2005.
Korean Office Action maield Aug. 31, 2005 (relevant portions translated to English).
Chinese Office Action issued Dec. 30, 2005.
Korean Office Action mailed Aug. 31, 2005 (relevant portions translated to English).

* cited by examiner

*Primary Examiner*—Ha Tran Nguyen
*Assistant Examiner*—Emily Y Chan
(74) *Attorney, Agent, or Firm*—Dickstein, Shapiro, LLP.

(57) ABSTRACT

An inspection apparatus comprises a fixed unit including a control device and a measurement device, and a moving unit including contact terminals, which are brought into contact with contacts formed on a printed board having electrode patterns subjected to electrical inspection (e.g., electrical conduction inspection). The contact terminals are connected to a connection switching device via a plurality of first wires, wherein the connection switching device is arranged in the moving unit for selectively switching over the first wires. A plurality of third wires are arranged for establishing connections between the fixed unit and the selectively-switched first wires, wherein the number of the third wires is smaller than that of the first wires.

3 Claims, 3 Drawing Sheets

INSPECTION APPARATUS FOR PRINTED BOARD

BACKGROUND OF THE INVENTION

1. Field of the Invention

This invention relates to inspection apparatuses for printed boards (i.e., printed circuit boards or printed wiring boards), in which electrical inspection is performed on printed boards by bringing contact terminals into contact with contacts of printed boards.

This application claims priority on Japanese Patent Application No. 2003-8937, the content of which is incorporated herein by reference.

2. Description of the Related Art

Conventionally, inspection has been performed on printed boards having electrode patterns upon detection of electrical conduction established with wires or lines; that is, an inspection apparatus is operated so as to bring contact terminals thereof into contact with contacts arranged on each printed board, an example of which is disclosed in Japanese Patent Application Publication No. Hei 11-340588. Such an inspection apparatus has numerous contact terminals attached to a moving unit, wherein contact terminals are connected with one ends of wires, other ends of which are attached to a fixed unit and are connected to a measurement unit for measuring detection signals transmitted thereto from the contact terminals.

On the inspection surface of the printed board, electrode patterns are laminated onto an insulating film having a plurality of contacts, which are electrically conducted with the electrode patterns. A prescribed material having an ability to elastically deform such as copper, is used for the formation of electrode patterns. In an electrical conduction inspection, a printed board is fixed onto the upper surface of an inspection instrument, which is formed so as to be planar, while the moving unit is vertically lowered down to the printed board so that contact terminals are brought into contact with contacts of the printed board. In addition, the printed board is formed overall like a sheet in which a plurality of electrode patterns are formed, and the contact terminals are fixed to a probe head arranged in the moving unit.

The aforementioned inspection apparatus incurs relatively large costs in the creation of a probe head that is appropriately designed in shape and size to match the entire surface of a printed board to be inspected. For this reason, when an inspection is performed on a printed board in which a plurality of units of electrode patterns are formed, a so-called step-and-repeat method is performed using an inspection probe head matching one of the units of electrode patterns paired electrode patterns so that the electrode patterns are respectively inspected in turn. Even though this method is used, the measurement unit accompanied with the fixed unit is connected with numerous wires, the number of which is identical to the number of contact terminals. Therefore, the conventional inspection apparatus has a drawback in that the wiring becomes bulky due to the numerous wires required between the moving unit and the fixed unit.

SUMMARY OF THE INVENTION

It is an object of the invention to provide an inspection apparatus for a printed board, in which the wiring can be improved not to become bulky by reducing the number of wires arranged between a moving unit and a fixed unit, and which can therefore increase the degree of freedom in terms of the moving distance and moving speed of the moving unit.

An inspection apparatus of this invention basically comprises a fixed unit having a control device and a moving unit having a plurality of contact terminals, which are brought into contact with a plurality of contacts on a printed board so as to perform electrical inspection. Specifically, it comprises a plurality of wires connected with contact terminals arranged in the moving unit, connection switching devices that are arranged in the moving unit so as to arbitrarily select and switch over wires within the plurality of first wires, a connection switching signal transmitter that is arranged in the fixed unit so as to transmit connection switching signals to the connection switching devices, a connection switching signal receiver that is arranged in the moving unit so as to receive connection switching signals, second wires that are arranged to connect together the moving unit and the fixed unit so as to allow transmission of connection switching signals towards the connection switching devices, and a relatively small number of third wires that are arranged to connect together the moving unit and the fixed unit so as to establish connections for a part of the first wires, the wires, which are switched over by the connection switching devices, with the fixed unit.

According to the aforementioned constitution of this invention, the moving unit is equipped with the connection switching devices for switching over the first wires being connected with the contact terminals; therefore, by arranging the second wires for transmitting connection switching signals and the third wires for connecting the 'selectively switched' first wires with the fixed unit between the fixed unit and the moving unit, it is possible to reliably transmit measurement signals towards the contact terminals. As a result, in spite of the conventional inspection apparatus, it is possible for the moving unit not to draw numerous wires causing bulky wiring in an electrical conduction inspection. Ends of the plurality of first wires connected with the contact terminals are connected with the connection switching devices fixed to the moving unit. This noticeably reduces lengths of numerous wires; therefore, this provides economical advantages.

In addition, the inspection apparatus of this invention is characterized by realizing multiplexing transmission by which connection switching signals are transmitted in time-division multiplex processing. This actualizes connections established between the moving unit and the fixed unit by use of a relatively small number of wires therebetween.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

This invention will be described in further detail by way of examples with reference to the accompanying drawings.

Figure 1:
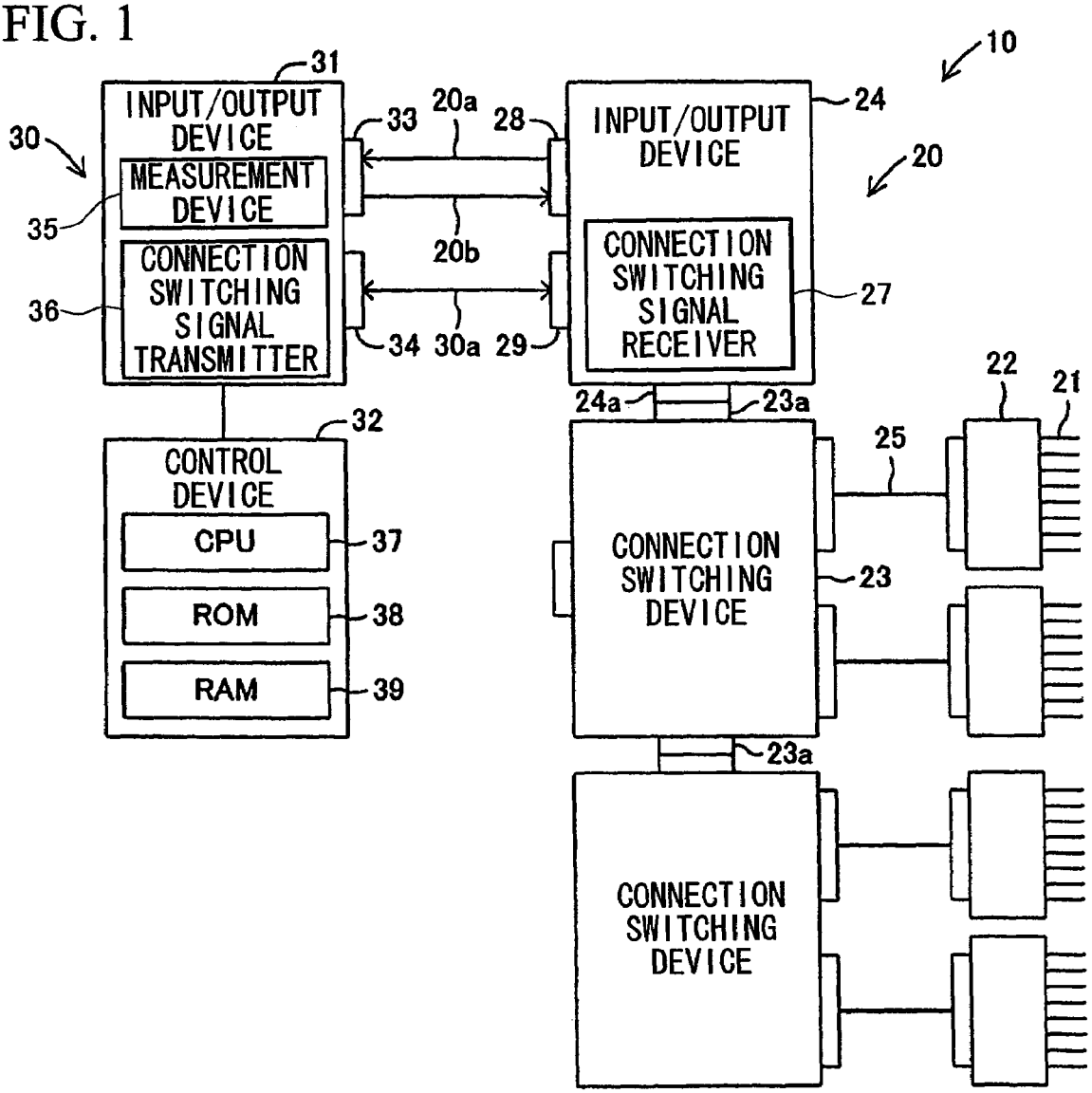
FIG. 1 is a block diagram showing essential parts and blocks of an inspection apparatus in accordance with a preferred embodiment of the invention.
Figure 2:
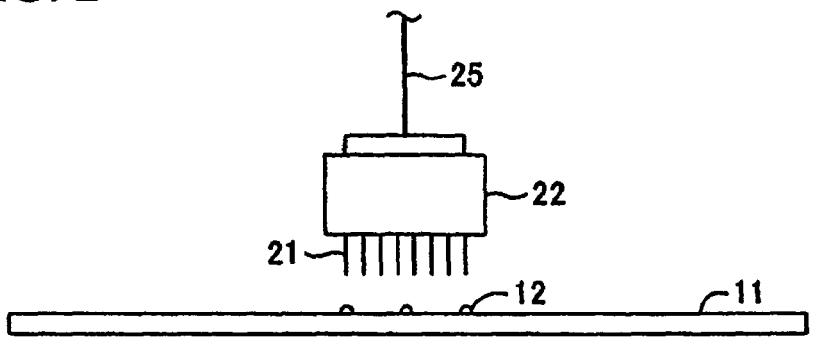
FIG. 2 is a side view diagrammatically showing contact terminals and contacts of a printed board, which are approximated each other to perform electrical conduction inspection.

FIG. 1 is a block diagram including electrical and mechanical parts, which diagrammatically shows the overall constitution and structure regarding essential parts of an inspection apparatus 10 for a printed board in accordance with a preferred embodiment of the invention. This inspection apparatus 10 performs an inspection on an electrode pattern (not shown) formed on a printed board 11 (shown in FIG. 2) which is an inspected subject, as to whether or not electrical conduction or insulation is adequately established with respect to the electrode pattern. Specifically, the inspection apparatus 10 comprises a setting unit on which the printed board 11 is set at a prescribed position, a moving unit 20 that can be moved along the surface of the printed board 11 by operating a drive fixed thereto, and a fixed unit 30 including a control unit for controlling various devices and units equipped therein, details of which will be described later. In addition, a plurality of contacts 12 electrically conducting with the electrode pattern are formed on the surface of the printed board 11.

Figure 3:
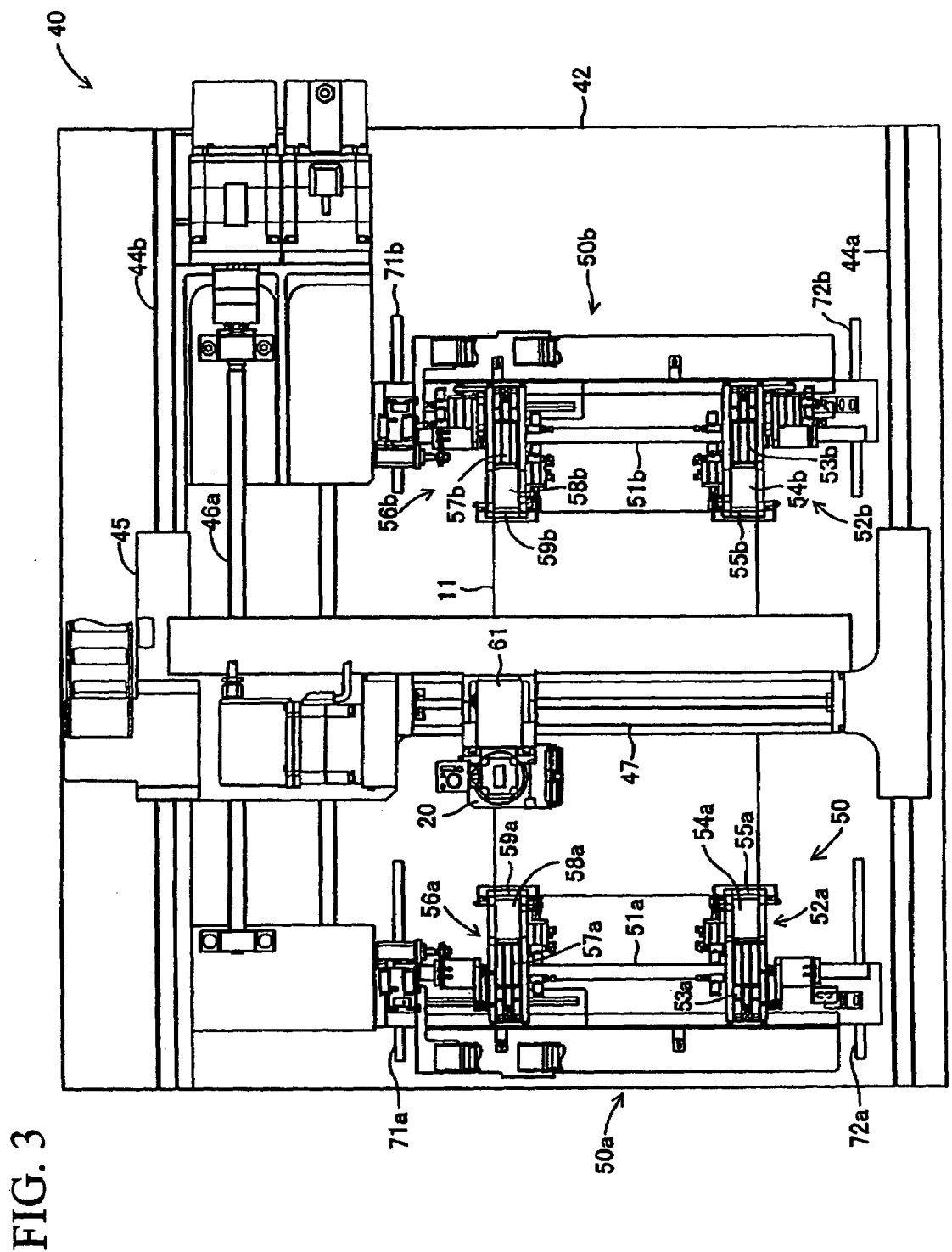
FIG. 3 is a plan view showing mechanical and electrical components installed in the housing of the inspection apparatus.
Figure 4:
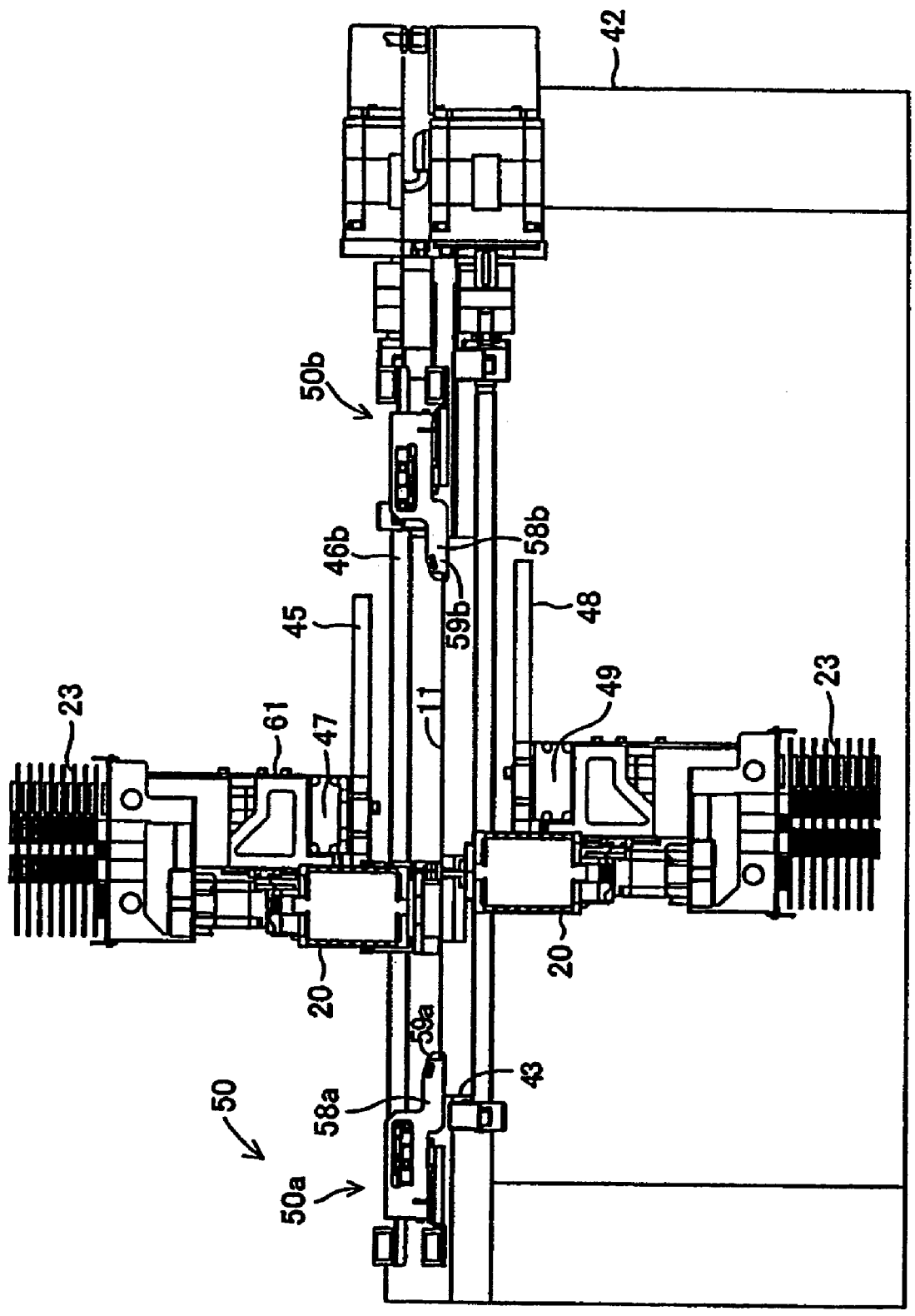
FIG. 4 is a front view showing selected components installed in the housing of the inspection apparatus.

The moving unit 20 is arranged inside of an inspection apparatus housing 40 shown in FIGS. 3 and 4, wherein it can be moved in an X-axis direction corresponding to left-right directions above the upper surface of the printed board 11, a Y-axis direction crossing at a right angle with the X-axis direction on the upper surface of the printed board 11, and a prescribed direction θ about a Z-axis direction three-dimensionally perpendicular to the X-axis direction and the Y-axis direction, wherein the X-axis direction corresponds to left-right directions above the upper surface of the printed board 11, and the Y-axis direction crosses at a right angle with the X-axis direction on the upper surface of the printed board 11. The inspection apparatus housing 40 further comprises a setting unit 50 on which the printed board 11 is arranged at a prescribed position, wherein as shown in FIG. 4, a pair of moving units 20 are respectively arranged above and below the printed board 11, which is set to the setting unit 50.

Both of the setting unit 50 and the moving unit 20 are disposed on a base 42 under conditions in which they can move by operating various drives, details of which will be described later. The base 42 is constituted by a frame having an upper surface on which a window-like hole portion 43 is formed. The setting unit 50 is constituted by a pair of support members 50a and 50b, which are respectively arranged on both end portions of the hole portion 43.

The support member 50a is constituted by a rail 51a lying along one edge of the hole portion 43, and a pair of supports 52a and 56a that can move along the rail 51a. The support 52a is constituted by a track extended in a direction in which the support 52a approaches to and draws apart from the printed board 11 (whereby the track is extended in the direction perpendicular to the rail 51a, for example), a drive section 53a comprising a drive realized by an air cylinder and the like, and a moving section 54a that can move along the track upon driving of the drive section 53a. In addition, a holder 55a for fixedly holding corners of the printed board 11 is formed at the tip end portion of the moving section 54a.

The support 56a is constituted symmetrically to the aforementioned support 52 in forward-backward directions, and it is constituted by a drive section 57a and a moving section 58a, wherein a holder 59a is formed at the tip end portion of the moving section 58a. The supports 52a and 56a can move along the rail 51 so as to increase or decrease the mutual distance therebetween, which can be adjusted in response to the width of the printed board 11. The support member 50a can move along rails 71a and 72a and is adequately positioned in response to the length of the printed board 11.

The support member 50b is constituted symmetrically to the aforementioned support member 50a in left-right directions, and it is constituted by a rail 51b, and a pair of supports 52b and 56b. The support 52b is constituted by a drive section 53b and a moving section 54b, wherein a holder 55b is formed at the tip end portion of the moving section 54b. Similarly, the support 56b is constituted by a drive section 57b and a moving section 58b, wherein a holder 59b is formed at the tip end portion of the moving section 58b.

Both of the supports 52b and 56b can move along a rail 51b so that they can adequately adjust the mutual distance therebetween in response to the width of the printed board 11. The support member 50b can move along rails 71b and 72b and is adequately positioned in response to the length of the printed board 11. In addition, the moving sections 54a and 58a of the support member 50a can move respectively along the tracks of the drive sections 53a and 57a, while the moving sections 54b and 58b of the support member 50b can move respectively along the tracks of the drive sections 53b and 57b. That is, four corners of the printed board 11 are respectively and fixedly held by the holders 55a, 59a, 55b, and 59b that are formed at the tip end portions of the moving sections 54a, 58a, 54b, and 58b, so that the printed board 11 is supported under tension.

The moving unit 20 arranged above the printed board 11 is attached to a support member 45 that can move along a pair of rails 44a and 44b, which are arranged forwards and backwards relative to the upper surface of the base 42. The support member 45 can move in left-right directions along the rails 44a and 44b upon driving of a rotary drive unit 46a. In addition, a drive section 47 comprising a track and a rotation shaft is attached to the support member 45.

The moving unit 20 is attached to a moving section 61, which is movably attached to the drive section 47, and it can move together with the moving section 61 upon driving of the drive section 47 in its longitudinal direction. In addition, the moving section 61 is equipped with a drive (not shown), which allows the moving unit 20 to move in a vertical direction and to rotate about a vertical axis when driven.

The other moving unit 20 that is arranged below the printed board 11 is accompanied with a support member 48 and a drive section 49, which are arranged being vertically symmetrical to the aforementioned support member 45 and the drive section 47, so that it can move vertically and rotate about a vertical axis.

As shown in FIG. 1 (which shows a single moving unit 20 for simplification of illustration), the moving unit 20 comprises a plurality of contact terminal supports 22 each having a plurality of contact terminals 21, a plurality of (e.g., two) connection switching devices 23 each connected with the contact terminal supports 22, and an input/output device 24 for performing transmission and reception of signals and data with respect to the fixed unit 30. The contact terminals 21 are connected with the connection switching devices 23 via wires 25, the number of which is identical to the number of contact terminals 21.

Each of the contact terminals 21 is formed like a thin needle, so that it is brought into contact with the corresponding contact 12 on the printed board 11. At this time, electricity is applied between the contact terminals, so that a decision is made as to whether or not electrical conduction is adequately established with respect to electrode patterns of the printed board 11 in response to values of electric resistances detected between the contact terminals 21. Such a decision is made based on a ratio against a prescribed inspection judging value that is determined in advance with reference to a certain electric resistance, which is measured in the past with respect to a certain printed board indicating a quality product. That is, in the electrical conduction inspection, when the detected electric resistance is equal to or less than the prescribed ratio against the inspection judging value, the inspected printed board is judged as a good product, whereas when the detected electric resistance is greater than the prescribed ratio, the inspected printed board is judged as a defective product. In the case of the insulation inspection, when the detected electric resistance is equal to or greater than the prescribed ratio against the inspection judging value, the inspected printed board is judged as a good product, whereas when the detected electric resistance is less than the prescribed ratio, the inspected printed board is judged as a defective product.

The connection switching device 23 is equipped with a circuit for switching over start/stop conditions with respect to the contact terminal supports 22 and the contact terminals 21 respectively. Switching them is actualized by switches arranged inside of the connection switching device 23 in response to switching signals sent from a control device 32. Each of the connection switching devices 23 is connected with the wires 25, the number of which is identical to the number of the contact terminals 21 connected thereto via the contact terminal supports 22, so that inspection signals are sent to the contact terminals 21 via the wires 25.

The connection switching device 23 is connected with a plurality of (e.g., two) contact terminal supports 22 by way of the wires 25, wherein one end of a bundle collecting all the wires 25 extended from each contact terminal support 22 is connected to the connection switching device 23. Each of the connection switching devices 23 has at least one connection terminal 23a arranged at a prescribed position thereof, so that a plurality of connection switching devices 23 can be interconnected together by mutually connecting the connection terminals 23a thereof. In addition, a prescribed connection switching device 23 is connected with the input/output device 24 having a connection terminal 24a, which is connected with the connection terminal 23a.

The input/output device 24 incorporates a connection switching signal receiver 27 that receives connection switching signals and converts them into switchover signals. In addition, the input/output device 24 has an input/output port 28 for inputting inspection signals transmitted thereto from an input/output device 31 and for outputting inspection signals, which are transmitted to the printed board 11 via the contact terminals 21 and are then returned thereto, to the input/output device 31, details of which will be described later. Furthermore, the input/output device 24 has an input port 29 for receiving connection switching signals output from the input/output device 31. The input/output port 28 is connected with wires 20a and 20b, and the input port 29 is connected with wires 30a. The number of the wires 20a, 20b, and 30a is extremely reduced as compared with the number of the wires 25.

The fixed unit 30 is arranged inside of a control panel (not shown) that is installed in proximity to the inspection apparatus housing 40. It comprises a control device 32 as well as the aforementioned input/output device 31 for performing transmission of connection switching signals and for performing transmission and reception of inspection signals with respect to the input/output device 24 of the moving unit 20.

The input/output device 31 has an input/output port 33 that is connected with ends of the wires 20a and 20b so as to output inspection signals, which are transmitted to the printed board 11 via the contact terminals 21 and are then returned thereto. It also has an output terminal 34 that is connected with ends of the wires 30a so as to output switchover signals, which are sent from the control device 32, to the moving unit 20. In addition, the input/output device 31 also comprises a measurement device 35 that is constituted by the circuitry for measuring inspection signals, which are sent from the moving unit 20, and a connection switching signal transmitter 36 for transmitting connection switching signals to the connection switching signal receiver 27.

The control device 32 comprises a CPU 37, a ROM 38, and a RAM 39. The ROM 38 stores various programs such as programs implementing operations of the setting unit and drive sections and programs controlling the connection switching devices 23 to implement switchover operations on the contact terminals 21. The RAM 39 stores various data such as inspection signals required for performing electrical conduction inspections, contents of which can be rewritten as necessary. The CPU 37 controls the inspection apparatus 10 based on various programs and data stored in the ROM 38 and/or the RAM 39, and it also realizes judgement as to inspection results, which are obtained from measurement results produced by the measurement device 35.

The control device 32 is also connected with the aforementioned drive sections 46a and 47 via wires (not shown); therefore, it performs drive controls thereon. In addition, the inspection apparatus 10 is equipped with an operation panel (not shown) that is manually operated by the user (e.g., a human operator) and a display panel for displaying inspection results. As the wires 30a connecting between the input/output devices 24 and 31, it is possible to use a so-called digital bus or a cable having digital serial communication functions.

When the inspection apparatus 10 having the aforementioned structure and constitution is used to perform electrical conduction inspection on the printed board 11, the user firstly sets the printed board 11 onto the setting unit 50. Then, by driving the rotary drive unit 46a and the like, the contact terminal support 22 is moved above prescribed contacts 12 of the printed board 11. The contact terminal support 22 is descended down so that the contact terminals 21 are brought into contact with the contacts 12. Under this condition, electrical inspection is performed on an electric pattern of the printed board 11. Details will be described later.

In the above, each of the drive sections is adequately driven in response to an instruction signal output from the CPU 37, thus causing movement on the corresponding moving section. The contact terminal supports 22 are selectively operated by the connection switching device 23 responding to a switchover signal output from the CPU 37. The instruction signal output from the CPU 37 is transmitted as a digital signal via the input/output device 31 and the wires 30a; then, it is supplied to the input/output device 24.

In the aforementioned condition, when the input/output device 24 receives the contact switching signal from the input/output device 31, the connection switching device 23 correspondingly switches over the wires 25 so that prescribed contact terminals 21 are brought into contact with the corresponding contacts 12 on the printed board 11. Then, an inspection signal output from the input/output device 31 is transmitted via the wires 20b, the input/output device 24, and the connection switching device 23 in turn, and is then applied to the printed board 11. The inspection signal applied to the printed board 11 via one contact terminal 21, which is brought into contact with one contact, is picked up from the other contact terminal 21, which is brought into contact with the other contact; then, it is returned to the input/output device 31 via the connection switching device 23, the input/output device 24, and the wires 20a in turn. Based on the returned inspection signal, the measurement device 35 performs measurement, i.e., electrical inspection, on a certain inspected area on the printed board 11.

In order to perform electrical inspection with respect to a next inspected area on the printed board 11, each of the drive sections is adequately driven so as to cause movement on the corresponding moving section, whereby the contact terminal support 22 is raised and is moved towards the next inspected area on the printed board 11. Then, the contact terminal support 22 is lowered so as to engage electrical inspection on the next inspected area on the printed board 11. By sequentially repeating the aforementioned operations, all the inspected areas on the printed board 11 are completely electrically inspected.

As described above, the inspection apparatus 10 of this invention is characterized by providing connection switching devices 23, by which the contact terminals 21 and the wires 25 are switched over and are adequately connected with the input/output port 28 in response to connection switching signals output from the fixed unit 30. Therefore, the measurement device 35 sequentially receive inspection signals, which are initially applied to the prescribed contacts 12 of the printed board 11 and are then returned thereto from the input/output device 24. Thus, it is possible to noticeably reduce the numbers of the wires 20a, 20b, and 30a establishing connections between the moving unit 20 and the fixed unit 30, compared with the number of the wires 25 and the number of the contact terminals 21. In addition, it is possible to increase degree of freedom in terms of the moving distance and moving speed of the moving unit 20, which in turn yields an improvement in degree of freedom for the electrical inspection and a reduction in the inspection time.

The aforementioned embodiments use time-division multiplex processing with respect to connection switching signals transmitted from the input/output device 31 of the fixed unit 30 to the input/output device 24 of the moving unit 20, thus reducing the numbers of the wires 20a, 20b, and 30a. Of course, it is possible to use other techniques for reducing the number of wires for use in transmission of connection switching signals; that is, multiplexing can be realized using different frequency bands in transmission.

As described heretofore, this invention has a variety of effects and technical features, which will be described below.

(1) An inspection apparatus of this invention basically comprises a fixed unit including a control device and a measurement device, and a moving unit including contact terminals, which are brought into contact with contacts on a printed board for the purpose of electrical inspection. This invention is characterized by arranging at least one contact switching device for adequately switching over wires connected with the contact terminals. Therefore, measurement signals (or inspection signals) can be reliably transmitted to the contact terminals by wiring between the moving unit and fixed unit for the purpose of transmission of connection switching signals and by wiring between the fixed unit and the wires connected with the contact terminals, which are adequately switched over. Thus, an electrical conduction inspection can be performed without requiring the moving unit to draw numerous wires causing bulky wiring. In addition, numerous wires arranged for the contact terminals are simply extended from the contact terminals to the connection switching device, which is arranged in proximity to the moving unit and is coupled to the moving unit. That is, it is possible to noticeably reduce the overall lengths of the wires arranged for the contact terminals, which in turn yields an economical advantage in cost.

(2) An important structural factor of this invention is to allow transmission of connection switching signals, which are transmitted from the fixed unit to the moving unit in order to adequately and selectively switch over the contact terminals brought into contact with the contacts on the printed board, in time-division multiplex processing. This noticeably reduces the total number of the wires connecting between the fixed unit and the moving unit.

(3) As described above, due to the reduction of the overall lengths of the numerous wires arranged for the contact terminals, which are adequately brought into contact with the contacts on the printed board, and due to the reduction of the total number of the wires connecting between the fixed unit and the moving unit for the purpose of transmission and reception of inspection signals and connection switching signals, it is possible to noticeably improve a degree of freedom in terms of the moving distance and moving speed of the moving unit, while avoiding bulky wiring between the fixed unit and the moving unit.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. An inspection apparatus for electrical inspection of a printed board having a plurality of contacts thereon, comprising:
   a fixed unit having a control device that controls the inspection apparatus;
   a moving unit operable to perform sequential inspection of the printed circuit board, the moving unit having a plurality of contact terminals that are respectively brought into contact with a first plurality of contacts on the printed board, the moving unit being operable to move above the surface of the printed board by operating a drive fixed thereto, and bring the plurality of the contact terminals of the moving unit in contact with a second plurality of contacts on the printed circuit board;
   a plurality of first wires directly connected with the plurality of contact terminals in the moving unit;
   at least one connection switching device arranged in the moving unit and connected with the first wires, for selectively switching over the plurality of first wires in response to connection switching signals;
   a connection switching signal transmitter arranged inside of the fixed unit, for transmitting the connection switching signals;
   a connection switching signal receiver arranged inside of the moving unit, for receiving the connection switching signals;

a plurality of second wires connected with the fixed unit and the moving unit for transmission of the connection switching signals from the fixed unit to the moving unit; and a plurality of third wires, the number of which is less than the number of the first wires and which is arranged between the fixed unit and the moving unit, for establishing connections between the fixed unit and a part of the first wires, which are switched over by the at least one connection switching device in response to the connection switching signals.

2. An inspection apparatus according to claim 1, wherein the connection switching signals are transmitted from the fixed unit to the moving unit in time-division multiplexing.

3. An inspection apparatus according to claim 1, wherein the fixed unit further comprises a measurement device that sends inspection signals via the third wires to the contact terminals, a measurement being made by said measuring device being based on returned inspection signals.

* * * * *